(12) United States Patent
Sunaga et al.

(10) Patent No.: US 7,061,818 B2
(45) Date of Patent: Jun. 13, 2006

(54) MEMORY AND REFRESH METHOD FOR MEMORY

(75) Inventors: Toshio Sunaga, Ohtsu (JP); Shinpei Watanabe, Yokohama (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/063,069

(22) Filed: Mar. 15, 2002

(65) Prior Publication Data

US 2002/0141271 A1  Oct. 3, 2002

(30) Foreign Application Priority Data

Mar. 29, 2001  (JP) .............................. 2001-095399

(51) Int. Cl.
G11C 7/00  (2006.01)

(52) U.S. Cl. ................. 365/222; 365/233; 365/189.01; 365/189.04

(58) Field of Classification Search ................. 365/222, 365/203, 204, 230.01, 189.04, 233, 189.01
See application file for complete search history.

(56) References Cited

U.S. PATENT DOCUMENTS

| | | | | |
|---|---|---|---|---|
| 4,677,592 A | * | 6/1987 | Sakurai et al. | 365/222 |
| 4,710,764 A | * | 12/1987 | Van Cang | 340/728 |
| 4,757,217 A | * | 7/1988 | Sawada et al. | 307/480 |
| 5,321,697 A | * | 6/1994 | Fromm et al. | 371/10.1 |
| 5,432,743 A | * | 7/1995 | Kusakari | 365/196 |
| 5,517,454 A | * | 5/1996 | Sato et al. | 365/222 |
| 5,805,508 A | * | 9/1998 | Tobita | 365/189.09 |
| 6,134,169 A | * | 10/2000 | Tanaka | 365/222 |
| 6,185,137 B1 | * | 2/2001 | Sato et al. | 365/200 |
| 6,259,634 B1 | * | 7/2001 | Kengeri et al. | 365/189.04 |
| 6,275,437 B1 | * | 8/2001 | Kim et al. | 365/222 |
| 6,430,098 B1 | * | 8/2002 | Afghahi et al. | 365/203 |
| 6,654,303 B1 | * | 11/2003 | Miyamoto et al. | 365/222 |

\* cited by examiner

*Primary Examiner*—Connie C. Yoha
(74) *Attorney, Agent, or Firm*—Michael J. LeStrange

(57) ABSTRACT

The present invention discloses a memory, and a refresh method for memory, which performs a normal access and refresh one after another within one operation cycle of SRAM. The memory of the present invention comprises a refresh enable which directs execution of refresh, a row address counter that addresses a row address of memory cells to be refreshed, and an execution circuit which refreshes the memory cells of the addressed row address in response to the direction of execution of refresh.

8 Claims, 2 Drawing Sheets

MEMORY AND REFRESH METHOD FOR MEMORY

BACKGROUND OF THE INVENTION

1. Field of the Invention

The present invention relates to a memory and a refresh method for memory. More particularly, the present invention relates to a DRAM that is replaceable with SRAM and a method for refreshing such DRAM.

2. Background of the Invention

Since SRAM (static random access memory) can store data with small power, it is widely used as low-power memory. However, SRAM is comprised of six transistors per cell, thus the chip area increases greatly as the storage capacity increases. On the contrary, DRAM (dynamic random access memory) is comprised of one capacitor and one transistor per cell, thus the chip area of the cell for SRAM is 8 to 12 times larger than that of DRAM.

Replacing a low-power SRAM with DRAM has been considered to reduce the chip area. When replacing SRAM with DRAM, a memory that attempts seamless operations in random row access is suitable for this replacement. This memory does not use the conventional page mode and greatly reduces the cycle time by activating blocks on the basis of small array units (i.e., a plurality of blocks are created by dividing an array), and improves the random access performance for row addresses. The size of the block depends on the data storage capacity, that is, the number of cells contained in the array. For a memory that attempts seamless operations in random row access, a flat address is used instead of conventional two addresses RAS (row address strobe) and CAS (column address strobe). The scheme allows small array activation and a reduction in operating current.

However, DRAM needs to be refreshed periodically in order to store data, while refreshing is not required for SRAM. When replacing SRAM with DRAM, the problem is how to perform the refresh.

BRIEF SUMMARY OF THE INVENTION

Summary of the Invention

It is therefore an object of the present invention to provide a memory, and a refresh method for memory, which performs a normal access and refresh one after another within one operation cycle of SRAM.

In a first aspect of the present invention, there is provided a semiconductor memory, such as a DRAM, that accesses memory cells addressed by a row address and column address, wherein the DRAM comprises: refresh directing means for directing execution of refresh; addressing means for addressing a row address of the memory cells to be refreshed; and execution means for refreshing the memory cells of the addressed row address in response to the direction of execution of refresh.

In another aspect of the invention, there is provided a method for refreshing a DRAM, wherein memory cells are accessed by addressing a row address and column address, the method comprising the steps of: directing execution of refresh; addressing a row address of the memory cells to be refreshed; and refreshing the memory cells of the addressed row address in response to the direction of execution of refresh.

BRIEF DESCRIPTION OF THE SEVERAL VIEWS OF THE DRAWINGS

The foregoing and other features of the invention will become more apparent upon review of the detailed description of the invention as rendered below. In the description to follow, reference will be made to the several figures of the accompanying Drawings, in which.

DETAILED DESCRIPTION OF THE INVENTION

A first embodiment of a memory, and a refresh method for memory, according to the present invention will be described with reference to the accompanying drawings.

Figure 1:
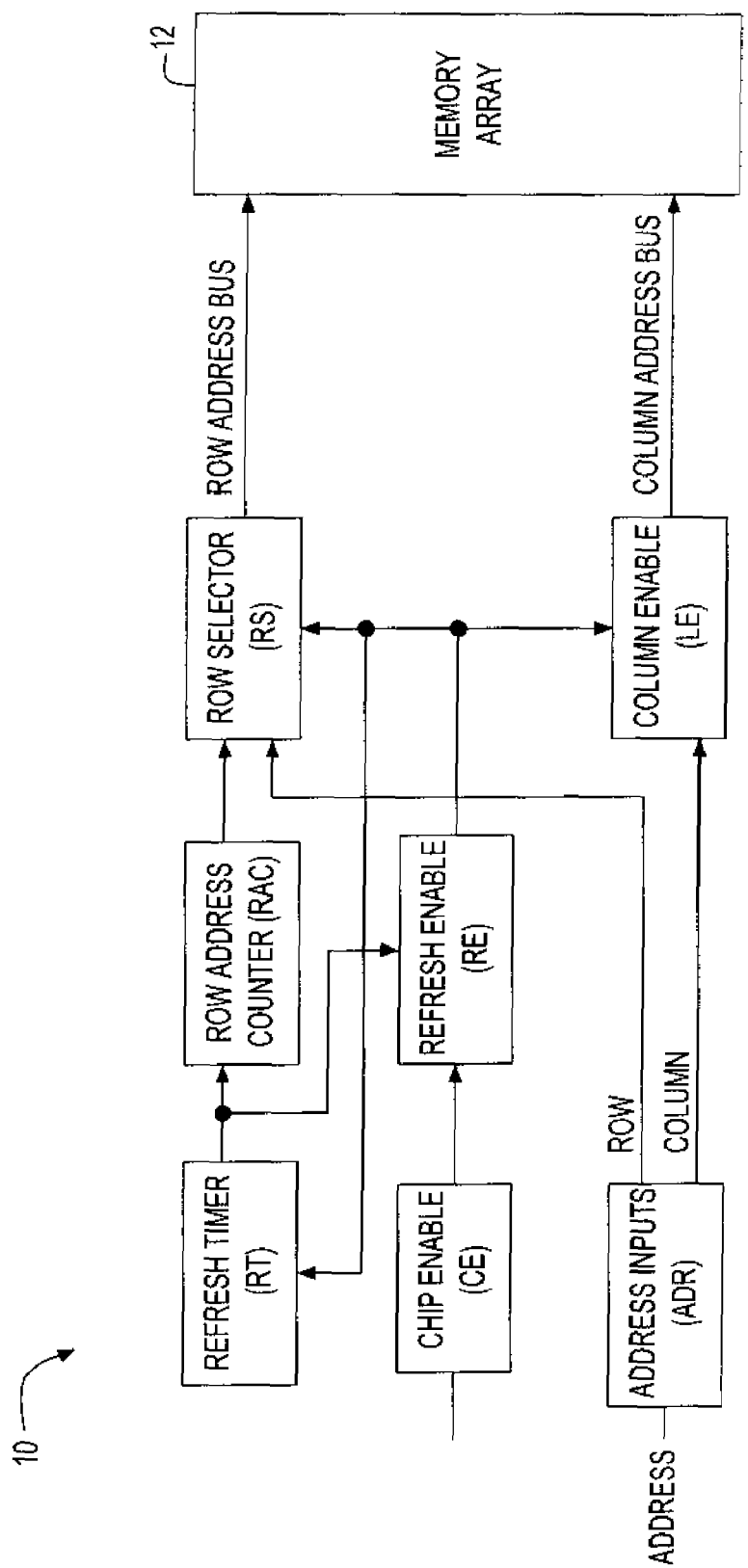
FIG. 1 depicts an exemplary block diagram of a memory according to the present invention.

As shown in FIG. 1, a semiconductor memory, such as DRAM 10 of the present invention comprises: refresh enable (RE) means (i.e., refresh directing means) for directing execution of refresh, a row address counter (RAC) (i.e., addressing means) for addressing a row address of the memory cells to be refreshed, and execution means for refreshing the memory cells of the row address addressed by RAC in response to the direction of execution of refresh from RE. In FIG. 1, the execution means are row selector (RS) and column enable (LE).

RAC comprises means for holding a row address of the memory cells to be refreshed, and means for updating the row address held in the address holding means in response to the direction of execution of refresh from RE. RS comprises means for selecting a row address to be accessed and a row address to be refreshed depending on whether there is a direction of execution of refresh. LE comprises means for temporarily stopping addressing of column addresses when a row address to be refreshed is selected.

Concerning the operation of DRAM 10, an address externally supplied is input to ADR (address inputs) and divided into a row address and column address. The row address is input to RS and then to memory array 12 through the internal bus, while the column address is input to LE and then to memory array 12 through the internal bus.

RS is also supplied from RAC with row address (R-row) to be refreshed. RS selects either the row address (R-row) from RAC or the row address (row) from ADR. Selection of the row address is performed by refresh enable (RE). Selection of the row address is also sent to LE, wherein LE temporarily stops addressing of column addresses when RE selects the R-row.

Selection of the row address (R-row) by RE is directed by a refresh timer (RT). RT is a timer circuit that directs RE to select the row address (R-row) at a predetermined time intervals such as 16 Åμs. RT also directs RAC to select the row address (R-row) at the predetermined time interval as well as directing RE. The row address (R-row) to be refreshed is stored in RAC, wherein the row address (R-row) being held is updated with a next row address to be refreshed whenever refresh is performed.

A refresh method using DRAM 10 of the present invention will be described. As shown in a timing chart of FIG. 2, read operations for three cycles are drawn by way of illustration, wherein refresh is directed for the second cycle.

Figure 2:
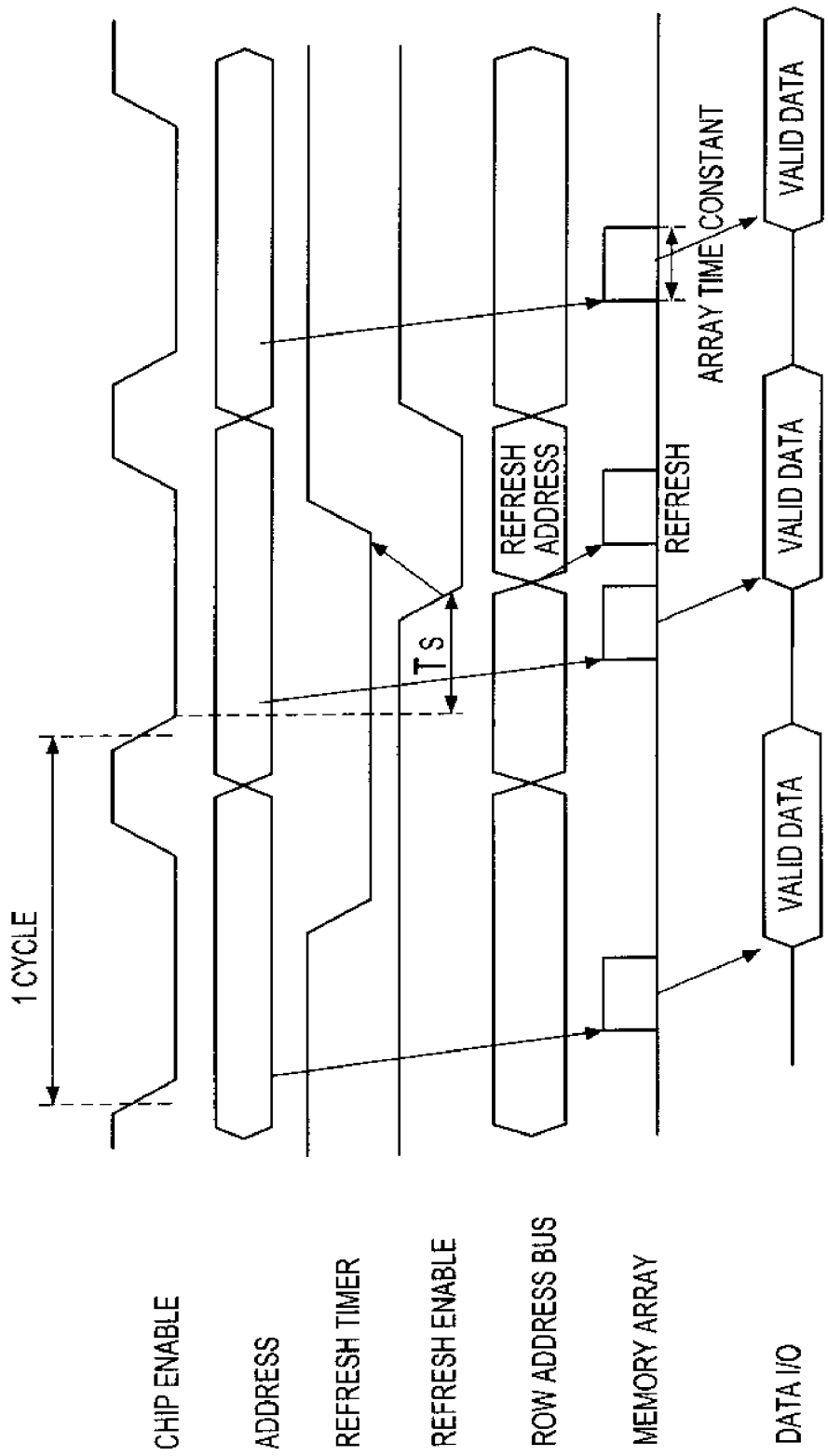
FIG. 2 depicts a timing chart of an embodiment of a refresh method of the present invention.

For the first cycle, an access is started by chip enable (CE) output becoming low, where the array corresponding to an accessed address (row, column) is activated. Note that an "array time constant" shown in FIG. 2 represents time that is required for a series of operations from rising of word lines to completion of precharge of bit lines.

For a memory that attempts seamless operations in random row access, small array units (i.e., a plurality of blocks created by dividing an array) can be activated and automatically precharged, the time required for this is called an array time constant, which is about 16 ns in the case of the process technology using about 0.25 Âµm minimum line width. Note that the operating speed of low-power SRAM is about 80 ns. After the array begins the operation, data is output to data I/O (input/output).

With regard to the present invention, it is assumed that output data is latched into an OCD (off chip driver) serving as an output buffer. Therefore, output data is held as valid data until CE returns to high. The array time constant is shorter than the cycle time of SRAM, i.e., 80 ns, whereby a read operation is completed with remaining temporal margin.

RT generates a signal at 16 Âµs intervals completely independent of a cycle of memory operations. FIG. 2 assumes that the signal occurs for the first cycle. Refresh would not be started yet if RT has generated the signal and the normal access is continued. Namely, at the second cycle, a memory access to the address (row, column) that was sent from ADR is completed first, and then refresh is started.

To complete the read cycle, Ts, refresh begins after about 30-ns delay from the moment when CE changes from high to low after RT becomes low. When RE becomes low, the row address output of RS is switched to the output (R-row) from RAC and further the column address output of LE is temporarily stopped in order to perform refresh onto R-row. When refresh is performed onto small arrays, refresh is completed with the same array time constant as that of the normal access. Within a cycle of about 80 ns, both 16 ns of array time constant for reading and refresh are thoroughly completed.

As shown in FIG. 2, RT is reset and starts a new count when RT becomes low. As such, RE may be reset internally with a delay circuit or may be reset when CE returns to high. The third access is a read operation that includes no refresh as with the first access.

Refresh for DRAM 10 is performed for a normal read or write cycle. Refresh operation is transparent to the outside. Therefore, a memory controller can handle memory just in the same way as SRAM. Since refresh is performed on the basis of small array units (i.e., a plurality of blocks created by dividing an array) just in the same way as normal accesses, a period of refresh becomes shorter than typical 16 Âµs, thereby resulting in more frequent refresh operation. However, since refresh operation is completely accommodated within a cycle, there is no adverse impact on memory performance. Though current consumption somewhat increases because of frequent refresh operations, it may be possible to reduce power consumption by enlarging the small arrays to be refreshed to reduce the frequency of refresh depending on an array time constant and a cycle time of SRAM.

A method has been described with respect to refresh when a memory is operating, though normal self-refresh may be performed in the standby state. Reducing a refresh cycle time by utilizing activation of small arrays allows an access and refresh of DRAM 10 to be performed one after another within one cycle of SRAM, whereby refresh of DRAM 10 is completely transparent to a user so that SRAM is able to be completely replaced with DRAM 10.

The embodiments of a memory, and a refresh method for memory, of the present invention have been described, however, it should not be construed that the present invention is limited to those embodiments. The present invention will be improved, modified and changed by those skilled in the art without departing from the spirit and scope of the invention.

As discussed above, according to the present invention, a normal access and refresh of DRAM can be performed one after another within one cycle time of SRAM, whereby refresh is transparent to the outside so that SRAM is able to be replaced with DRAM of the present invention.

What is claimed is:

1. A memory array that accesses a plurality of memory cells addressed by a row address and a column address, wherein the memory array comprises:
    a refresh enable circuit which directs execution of refresh of the memory cells;
    a row address counter that addresses a row address of a first of the memory cells to be refreshed;
    a refresh timer providing a signal to the refresh enable circuit at a predefined interval independent of an external access of the memory array; and
    an execution circuit, integral to the memory array, which refreshes the first memory cells in response to the direction of the refresh enable circuit, wherein the refresh of the first memory cells occurs serially within the same clock cycle as transmission of data from a read/write access of a memory cell corresponding to any address of the memory array.

2. The memory array according to claim 1, wherein said row address counter holds a row address of the memory cells to be refreshed, and updates the row address held in said row address counter with a next row address to be refreshed in response to the direction of execution of refresh.

3. The memory array according to claim 1, wherein said execution circuit comprises:
    a selector which selects a row address to be accessed and a row address to be refreshed when there is a direction of execution of refresh; and
    an enabler which temporarily stops addressing of column addresses when a row address to be refreshed is selected.

4. A method for refreshing a memory array, wherein a plurality of memory cells are accessed by addressing a row address, the method comprising the steps of:
    addressing a row address of the memory cells to be refreshed; and
    refreshing the plurality of memory cells in response to the direction of a refresh enable signal occurring at a predefined time interval independent of an external access of the memory array, wherein refreshing of the plurality of memory cells occurs serially within the same clock cycle as a transmission of data from a read/write access of a memory cell corresponding to any address of the memory array.

5. The method according to claim 4, wherein the step of addressing comprises:
    reading the row address of the memory cells to be refreshed in response to the direction of execution of refresh; and
    updating the row address to be refreshed after reading.

6. The method according to claim 4, wherein the step of refreshing comprises:
    selecting a row address to be accessed and a row address to be refreshed when there is a direction of execution of refresh; and
    temporarily stopping addressing of column addresses when a row address to be refreshed is selected.

7. The method according to claim 6, wherein the step of selecting comprises:
    selecting and accessing a row address to be accessed when there is a direction of execution of refresh; and
    selecting and refreshing a row address to be refreshed after said accessing step.

8. The memory array according to claim 1, wherein the execution circuit comprises:
    a row selector circuit and a column enable circuit.

* * * * *